United States Patent
Gruber et al.

(10) Patent No.: US 8,272,120 B2
(45) Date of Patent: Sep. 25, 2012

(54) APPARATUS FOR APPLYING SOLDER TO SEMICONDUCTOR CHIPS USING DECALS WITH APERATURES PRESENT THEREIN

(75) Inventors: Peter A. Gruber, Mohegan Lake, NY (US); Jae-woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/186,815

(22) Filed: Jul. 20, 2011

(65) Prior Publication Data

US 2011/0272450 A1 Nov. 10, 2011

Related U.S. Application Data

(62) Division of application No. 12/731,802, filed on Mar. 25, 2010, now Pat. No. 8,053,283.

(51) Int. Cl.
*B23P 19/00* (2006.01)
(52) U.S. Cl. .......................... 29/729; 257/779
(58) Field of Classification Search ............ 29/739–742, 29/832, 834, 842–843; 228/180.21–180.22, 228/215, 256; 257/21.508, 779; 438/108.118
See application file for complete search history.

(56) References Cited

U.S. PATENT DOCUMENTS

| | | | |
|---|---|---|---|
| 5,128,746 A | 7/1992 | Pennisi et al. | |
| 5,659,952 A * | 8/1997 | Kovac et al. | 29/840 |
| 5,673,846 A | 10/1997 | Gruber | |
| 6,230,400 B1 * | 5/2001 | Tzanavaras et al. | 29/840 |
| 6,746,896 B1 | 6/2004 | Shi et al. | |
| 7,554,206 B2 * | 6/2009 | Haba et al. | 257/780 |
| 8,053,282 B2 * | 11/2011 | Lu | 438/118 |

* cited by examiner

*Primary Examiner* — Minh Trinh
(74) *Attorney, Agent, or Firm* — Scully, Scott, Murphy & Presser, P.C.; Daniel P. Morris, Esq.

(57) ABSTRACT

An apparatus for applying solder to semiconductor chips is provided that employs a plurality of apertured decals to define areas for engaging solder on a semiconductor chip. Each of the plurality of decals includes an upper, center and bottom layer having apertures present therethrough. The apparatus fills the apertures with solder. The upper and bottom layers of the apertured decals are removed to provide solder portions projecting from the center layer. The apparatus provides a station for applying an adhesive layer to the exposed surfaces of the center layer having the solder portions projecting therefrom. The apparatus includes a station for contacting the solder and adhesive to the semiconductor chip. The apparatus also includes a separating structure for detaching the portion of the center layer that is in contacting to the semiconductor chip through the solder.

9 Claims, 15 Drawing Sheets

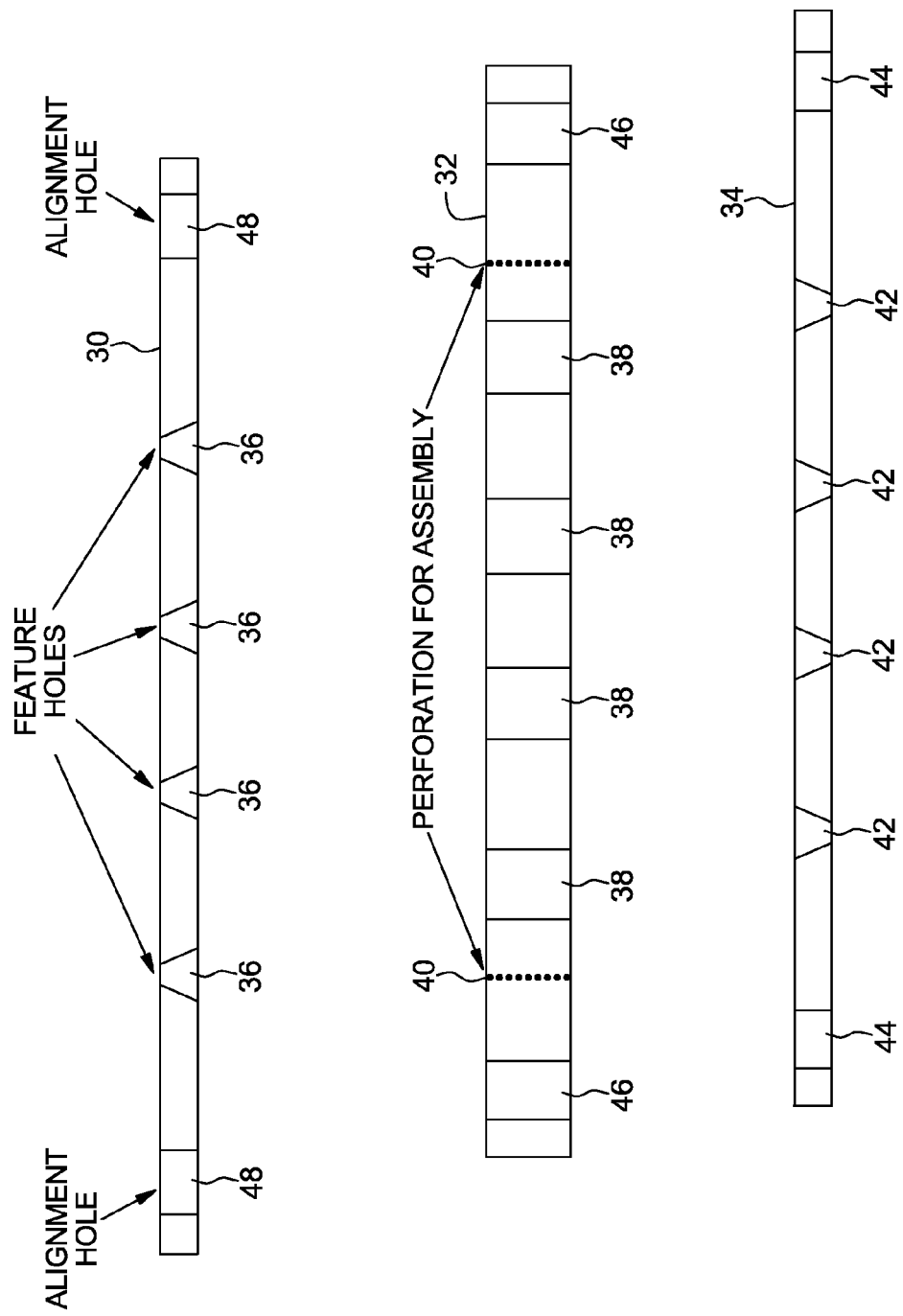

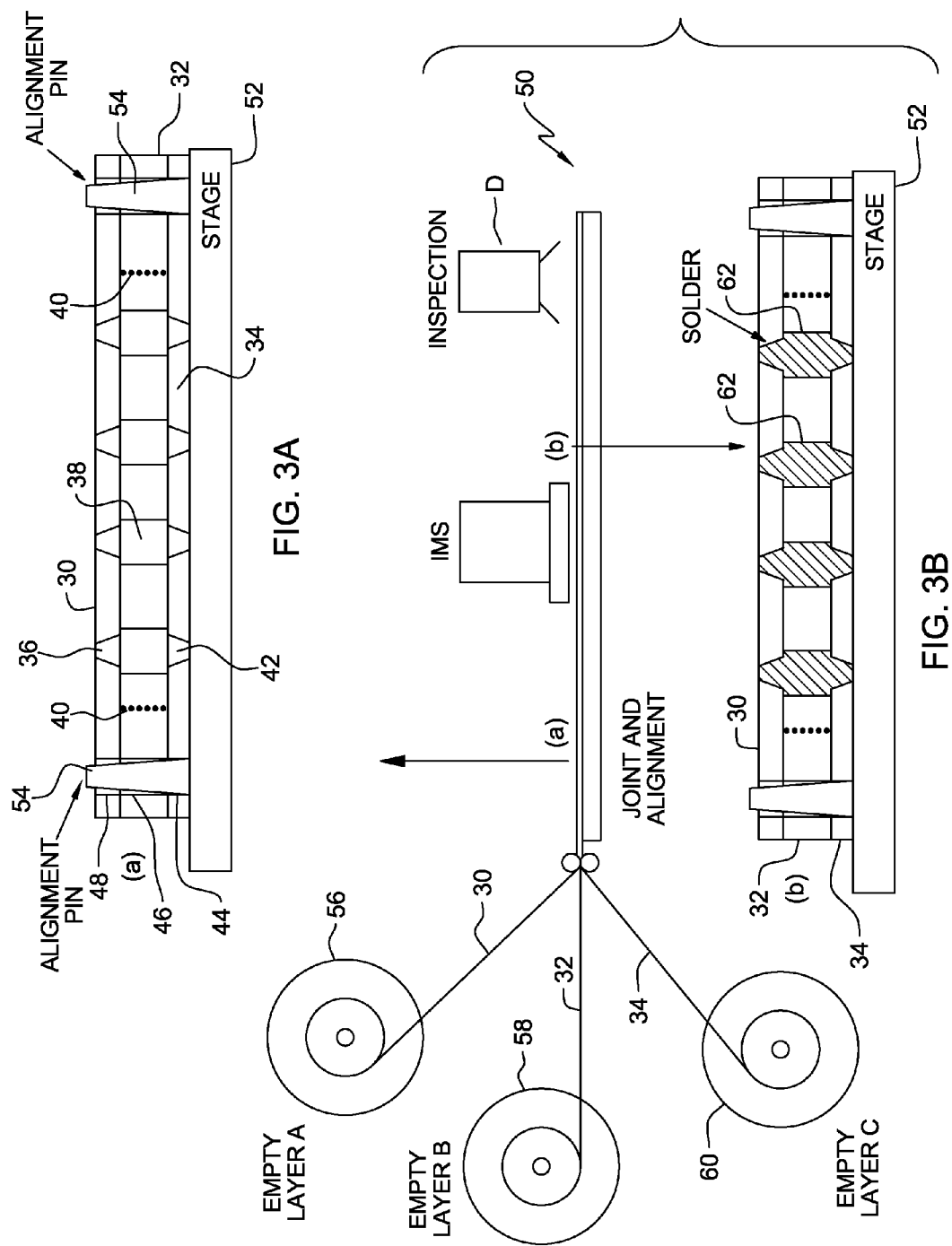

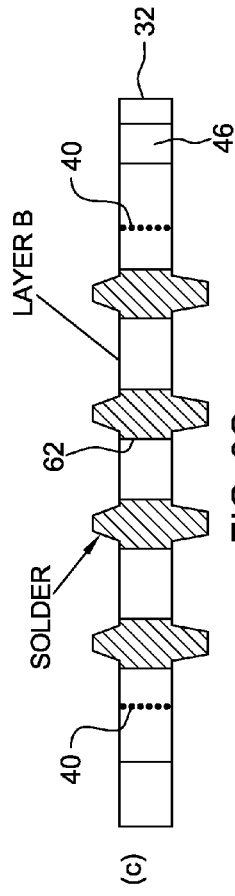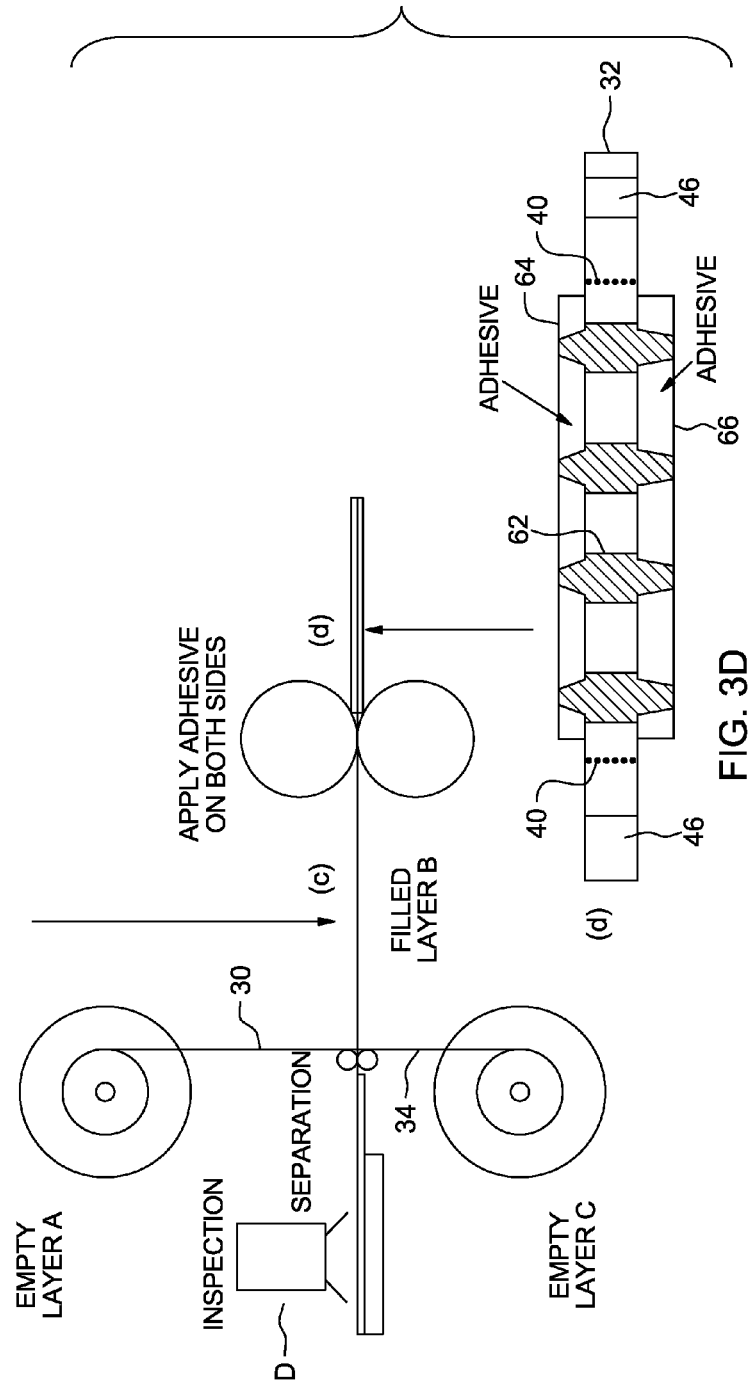

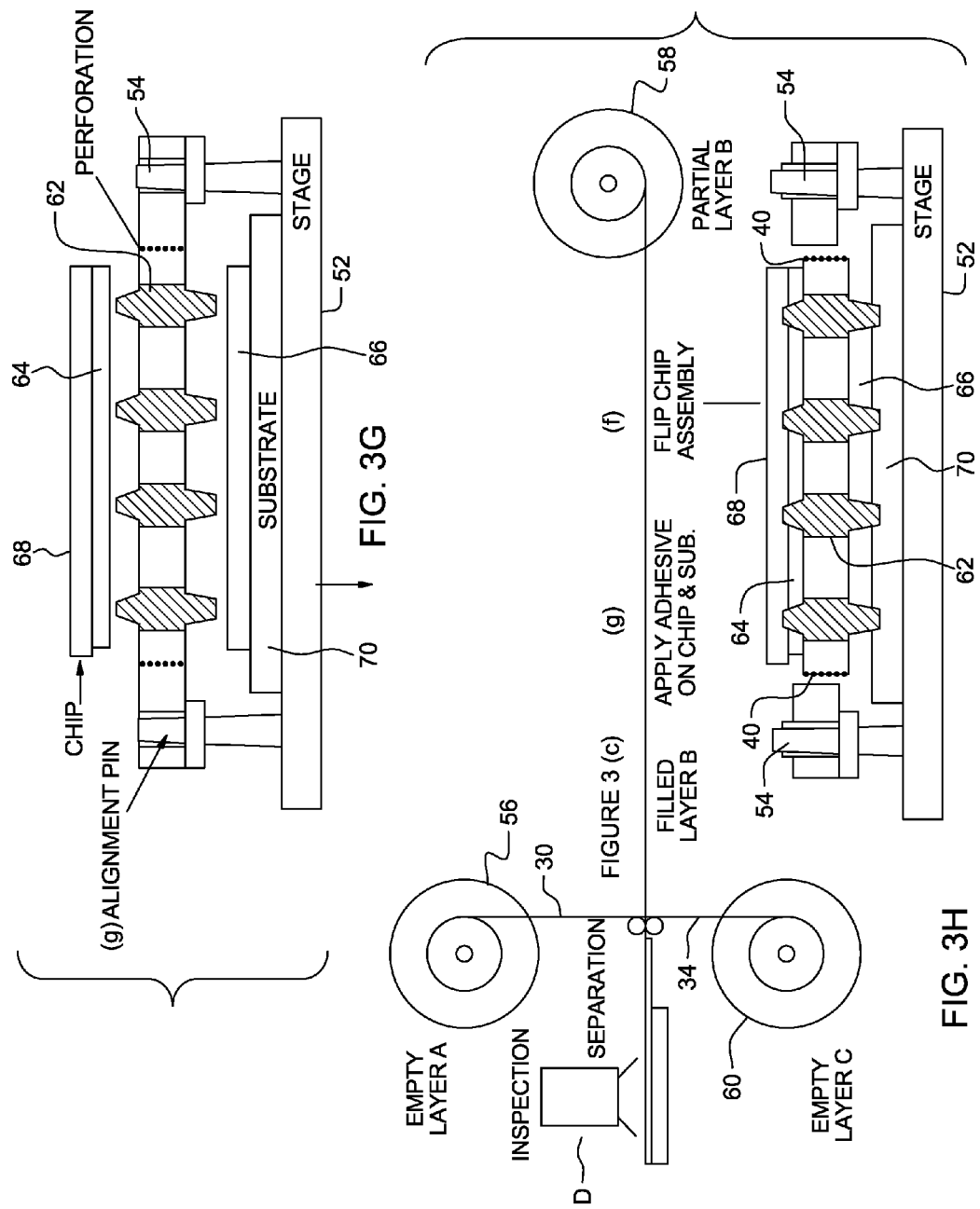

APPARATUS FOR APPLYING SOLDER TO SEMICONDUCTOR CHIPS USING DECALS WITH APERATURES PRESENT THEREIN

RELATED APPLICATIONS

This application is a divisional of U.S. application Ser. No. 12/731,802, filed Mar. 25, 2010, which has issued as U.S. Pat. No. 8,053,283.

FIELD OF THE INVENTION

The present invention relates to a die level integrated interconnect decal manufacturing method and apparatus for implementing the method. In accordance with the current state of the technology concerning the soldering of integrated circuits and substrates, and particularly providing for solder decal methods forming and utilization, there are employed underfills which comprise liquid encapsulates and which are applied between a semiconductor chip and the substrate in order to enhance the reliability of a flip chip package. In particular, the underfill material increases the resistance to fatigue of controlled collapse chip connect (C4) bumps.

Concerning the foregoing, in accordance with a conventional method, a liquefied underfill is dispensed into and is adapted to fill a gap or stand-off height which is present between the semiconductor chip and the substrate through the intermediary of capillary force subsequent to the assembly of the chip to the substrate. In that connection, the capillary action is ordinarily slow in filling the stand-off height between the semiconductor chip and the substrate, and the curing of the liquid underfill requires a lengthy time period in a high temperature or oven environment. Consequently, the currently employed underfill processes represent a bottleneck in manufacturing time. Moreover, due to the miniaturization of the various electronic devices which renders the stand-off height which is present between the semiconductor chip and substrate to become evermore narrow, particularly for very fine pitch applications under 100 µm pitch spacings due to a decrease in solder bump sizes, the underfill method causes the trapping of voids, i.e. entrapped air pockets in the electronic packages intermediate the semiconductor chips and substrates.

THE PRIOR ART

Heretofore, pursuant to the disclosure of Pennisi, et al., U.S. Pat. No. 5,128,746 there has been utilized a no-flow underfill which is intended to avoid the capillary flow of underfill and which combines solder joint reflow and underfill into a single step. The no-flow in the fill process is concerned with dispensing the underfill material on the substrates prior to the placement of a single chip.

Pursuant to Shi, et al., U.S. Pat. No. 6,746,896 B1, there is disclosed a wafer level underfill method which is also intended to avoid the capillary flow of underfill and which combines solder joints reflow and underfill curing processes into a single step. However, the wafer level underfill is applied on a bumped wafer and the wafer is diced into single chips, and thereafter each semiconductor chip with the underfill present thereon is aligned with and positioned on a substrate prior. In both of the foregoing instances of respectively the no-flow underfill and wafer level underfill processes there is, however, necessitated a separate solder bumping step on the semiconductor chip prior to the application of the underfill, and a thermal compression force is required in order to exclude underfill material from the solder joints.

Pursuant to a further aspect which is described in Gruber, U.S. Pat. No. 5,673,846, the latter of which is commonly assigned to the Assignee of the present application, there is provided a unique and novel solder decal which is rendered possible through the application of injection molding solder (IMS) process. In that instance, a decal is primarily employed as a mold which is fixed on forming a solder bumps on a wafer or on substrates. Moreover, the decal can also be employed as the actual underfill materials, wherein in one form, three superimposed layers of decals can produce solder features which are on both sides of one decal, i.e., a center decal, subsequent to peeling off two of the other layers.

Recapitulating the above-referenced state-of-the-art, no flow underfill (U.S. Pat. No. 5,128,746) and wafer level underfill (U.S. Pat. No. 6,746,896 B1) have been developed in the technology to avoid the capillary flow of underfill, and to combine the solder joint reflow and underfill curing processes into a single step. However, in the case of no-flow underfill, the filler material in the underfill is easily trapped in the solder joints, and may resultingly prevent the intended interconnection of components because the no-flow underfill is deposited on the substrate before implementation of the flip chip assembly. In the case of wafer level underfill, the underfill should be B-staged before the flip-chip assembly and this uncured material is a challenge for the wafer dicing process. Moreover, the visual recognition or ascertaining of the solder bumps during the assembly process also represents an issue for wafer level underfill.

SUMMARY OF THE INVENTION

Accordingly, it is an object of the present invention to provide a method of forming a die level integrated interconnect decal that facilitates a method of flip chip packaging which is independent of a wafer process. Typical flip chip technology requires a solder bumping process on a wafer for implementing interconnections to the substrate, followed by an underfill process either prior to or after a joining process as previously mentioned. Pursuant to the present invention, one or more decal layers have patterned through holes filled with molten solder by an IMS (Injection Molding Solder) process, whereby these are prepared independently in order to provide a bond between the chip and the substrate. The decals also play a role as underfill material, while solders filled in the through holes produce electrical interconnections between the chip and the substrate; such that this process which is independent from wafer processing reduces the overall time necessary for flip chip processing. The present invention also prevents the formation of voids in the gap that is present between the chip and the substrate, which is directly related to the reliability problems encountered in conventional underfill for fine pitch applications. Additionally, the present invention also provides a solution for fine pitch applications because the decal assumes a role in forming a spacer that prevents the collapse of solder joints during the flip chip assembly process.

BRIEF DESCRIPTION OF THE DRAWINGS

Exemplary aspects of the present invention may now be ascertained from the accompanying drawings, wherein:

FIG. 2A illustrates an exploded view, in section, of three decals with through-holes;

FIG. 3A through 3H illustrate diverse sequential processing steps and apparatus in diagrammatic representations utilized in production of the die level interconnect decals;

DETAILED DESCRIPTION

Figures 1A, 1B, 1C:
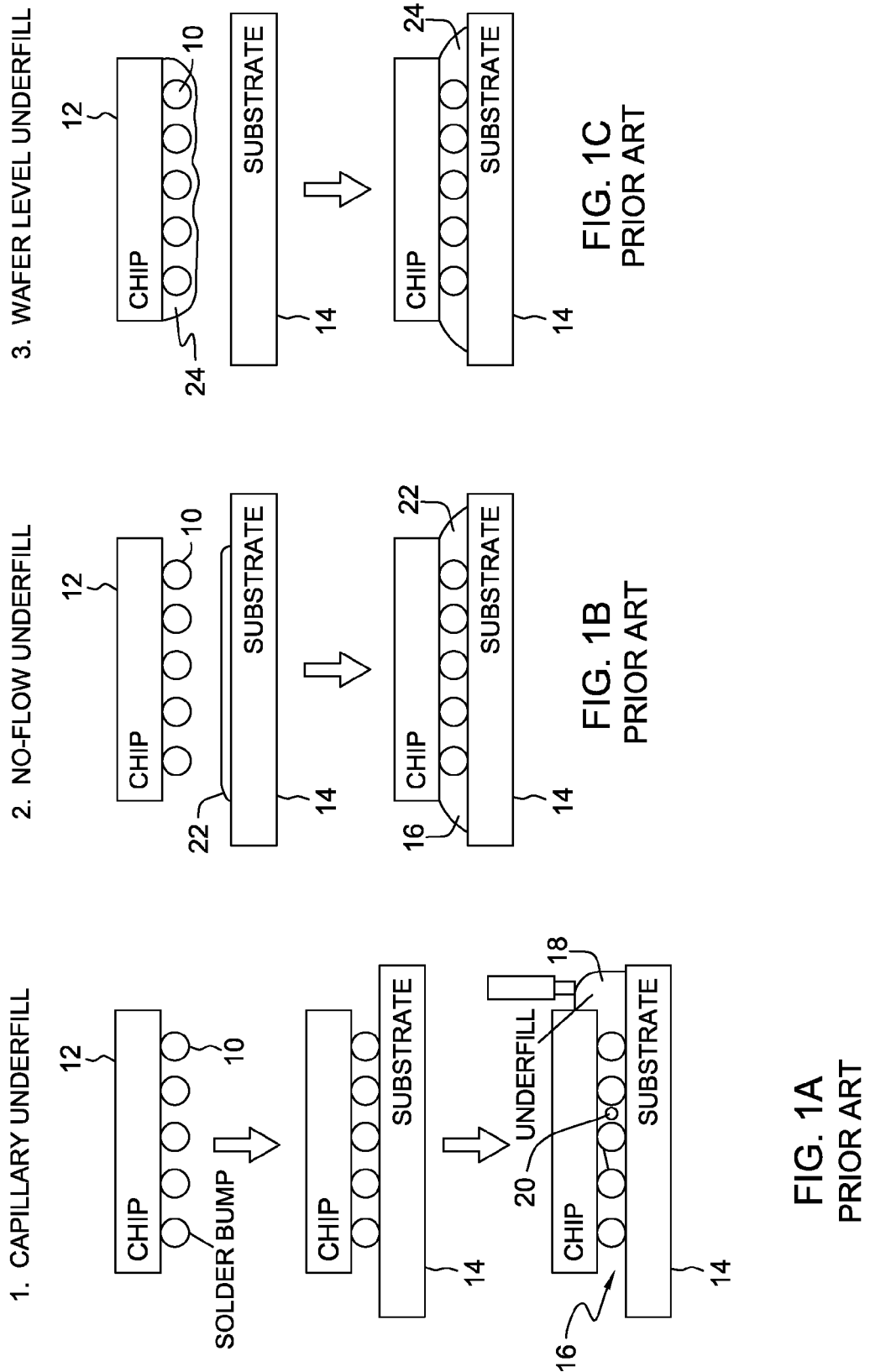
FIG. 1A illustrates a capillary underfill method pursuant to the prior art.
FIG. 1B illustrates a no-flow underfill method pursuant to the prior art.
FIG. 1C illustrates a wafer level underfill method pursuant to the prior art.

Referring in particular to the drawings, applicants note that FIGS. 1A-1C pertain to various prior art methods of utilizing underfill materials between semiconductor chips and substrates.

Thus, FIG. 1A discloses in sequence steps of a capillary underfill method whereby solder bumps 10 are attached to a semiconductor chip 12, then the latter is positioned on a substrate 14 so as to cause outer located bumps 10 to form a gap 16 between the semiconductor chip 12 and the substrate 14. Thereafter underfill material 18 in liquid form is filled into the gap 16 between the semiconductor chip and the substrate adapted to encompass the solder bumps. However, this method may lead to the entrapment of voids or air pockets 20 between the bumps 10, in view of the ever decreasing size of the gaps 16 that are present due to the miniaturization of the electronic packages and various components in the current technology.

As indicated in FIG. 1B of the drawings in an exploded view, there is illustrated a no flow underfill method pursuant to the prior art wherein a semiconductor chip 12 having solder bumps 10 attached thereto is placed in spaced relationship with a substrate 14, the surface of which is covered with a no-flow underfill material 22. Thereafter the chip 12 with the solder bumps 10 are pressed into the no-flow underfill material. This, however, provides for the possibility that the underfill material 22 may coat the surface of at least some of the solder bumps to, resultingly preventing electrical contact with the substrate, and thereby adversely affecting the reliability of any electronic package formed by this process.

Furthermore, with regard to FIG. 1C of the drawings which also illustrates in a exploded manner, a prior art wafer level underfill method, in that instance, the semiconductor chip 12 with the solder bumps 10 attached thereto, leave the latter already encased in a wafer level underfill material 24 which with the chip and bumps is then pressed down onto the substrate 14, and which may also, similar to the no-flow underfill, raise the possibility that the solder bumps 10 may be surface covered prematurely with underfill material 24, which may inhibit any proper or reliable electrical contact with operative components on the substrate 14.

Figure 2B:
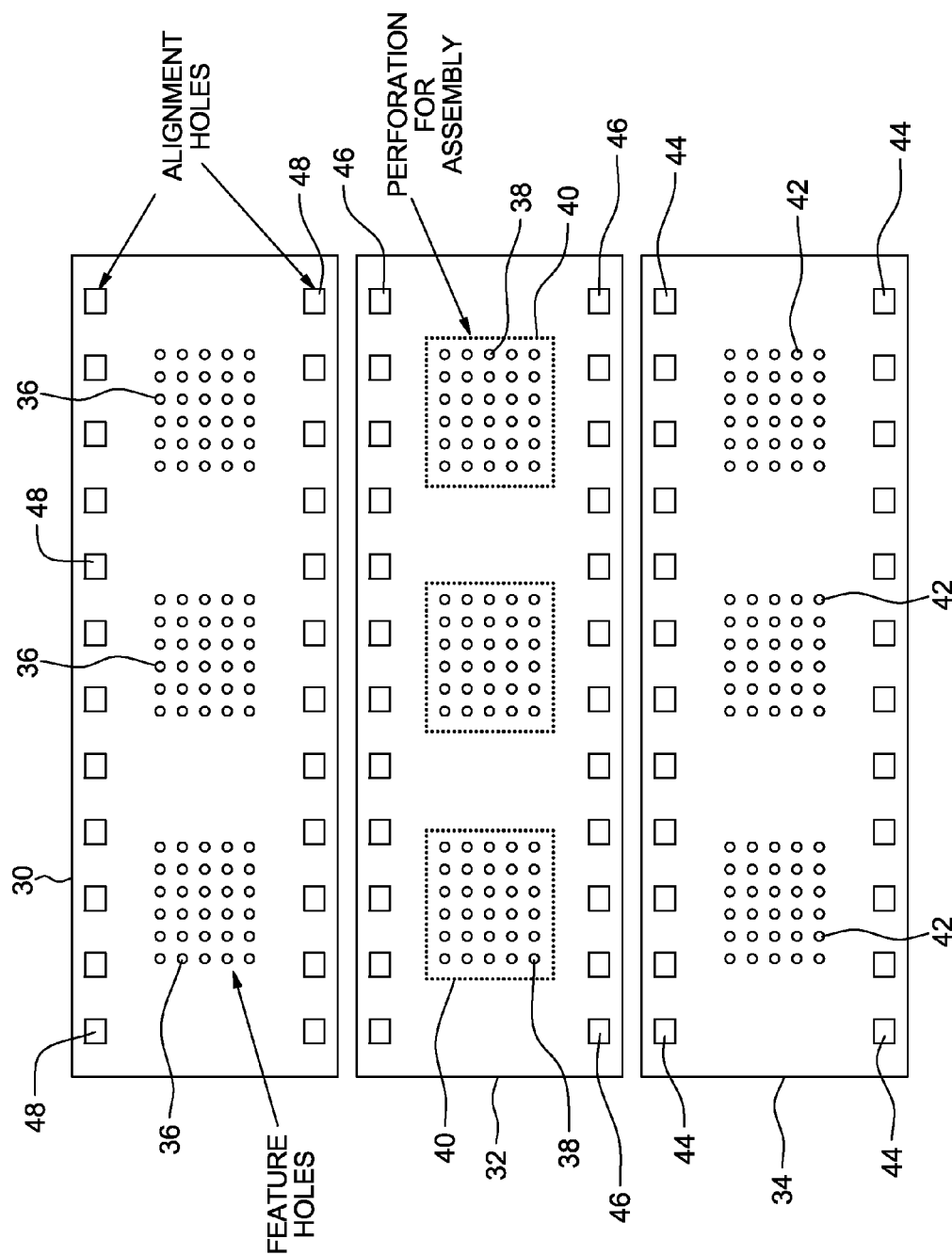
FIG. 2B illustrates, on a reduced scale, a plan view of the separated three decals in a distributed format.

Referring to FIGS. 2A and 2B of the drawings, there are disclosed three superimposable decal layers 30, 32, 34 which may be preferably in the form of film webs, and wherein the upper layer 30 thereof includes tapered feature holes 36, the center or intermediate layer 32 includes through-holes 38 which are adapted to be aligned with the feature holes 36 of the upper layer 30, and which center layer 32 contains perforations 40 for facilitating assembly of the layers extending around the periphery thereof, and further the third layer 34 on the opposite side of the center layer 32 having also through-extending tapered feature holes 42, including alignment holes 44 which are adapted to the aligned with similar alignment holes 46, 48 respectively present in the center and upper film web layers 30, 32. The perforations 40, as shown in the drawing figures form essentially rectangles encompassing areas on the center layer 32 about the arrays of feature holes 38, as illustrated more clearly in FIG. 2B, and enable separation of the areas of the center layer 32 in conjunction with flip chips that are applied thereto (not shown).

In essence, as shown in FIG. 2A of the drawings, in the upper and lower layers 30, 34 of the decals, each of the respective feature holes 36, 42 are tapered in a manner widening towards the center layer 32 so as to facilitate easy separation of these outer layers 30, 34 from the center layer 32 after implementation of an IMS (Injection Molding Solder) process directed to filling the feature holes with solder (not shown). Hereby, all of the decals 30, 32, 34 may be typically constituted from a suitable polyimide, for instance, such as Kapton, Upilex, Ultem (registered trademarks) which are able to withstand any IMS process which is conducted at the melting temperature of the employed solder. In particular, the center decal layer 32 which is intended to be utilized as the final underfill material after separation of the outer film layers 30, 34, may be made from a filler-containing polymer which will improve the properties of the CTE modulus, and similar physical characteristics.

Moreover, the various through holes of all types which are formed in each of the upper, center and lower decals can be produced by either by etched photolithographic processes, laser drilling, or the like.

In particular, it is an important aspect of the invention that the upper and lower decals 30, 34, which are arranged on, respectively, both or opposite sides of the center decal 32, as mentioned hereinabove, each have their tapered holes 36, 42 widen towards the surfaces of the center decal or layer 32 facing the through holes which are aligned therewith in the center decal. Thus, upon these feature holes 36, 38, 42 having been filled in the IMS process with solder and thereafter the solder cooled, so as to solidify, as elucidated, it is then possible to remove in suitable sequence the top decal or film layer 30 and thereafter the bottom decal or film layer 34, by peeling these away from the center decal 32 that is intended to form the underfill material between semiconductor chips and substrates.

Figures 3E, 3F:
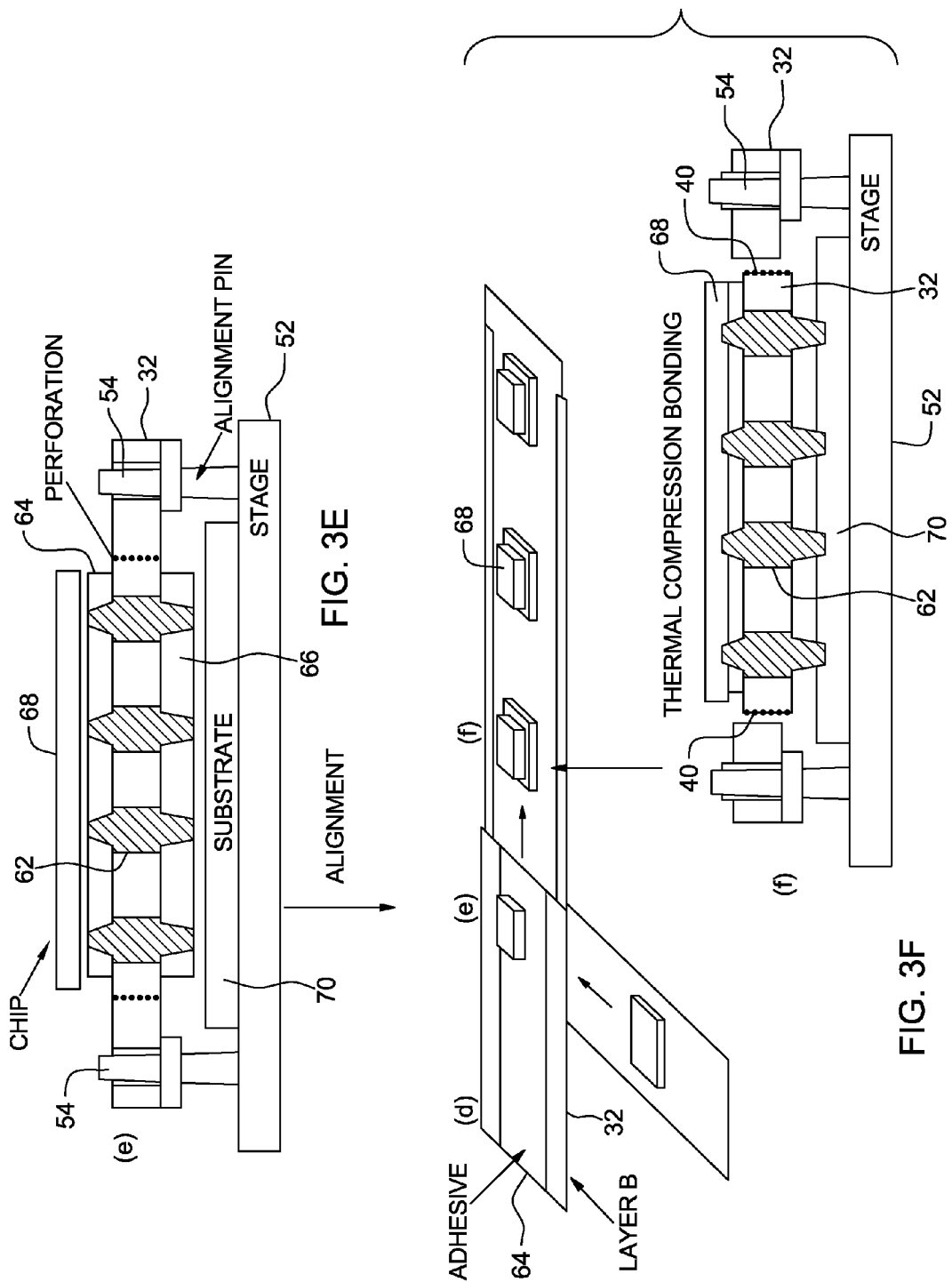

As diagrammatically illustrated in a sequential representation in FIGS. 3A through 3H, FIG. 3A, there is provided an apparatus 50 for processing the multilayer decal structure, including a carrier stage 52 having upstanding spaced alignment pins 54 which are adapted to extend through the superimposed three decal layers 30, 32, 34, with the pins in particular passing through the alignment holes 44, 46, 48 formed proximate the longitudinal edges thereof. The decals are primarily continuous being film webs fed from supply spools 56, 58 and 60. The arrangement shown in FIG. 3B illustrates the IMS process having been applied thereto in order to fill the aligned feature holes 36, 38 and 42 of the three superimposed decal layers 30, 32 and 34 with solder material 62, and thereafter subjecting the continuous multi-layered web to a suitable inspection at locale 'D', in order to make certain that all of the feature holes 36, 38 and 42 have been properly filled with the solder material 62 which as filled therein by means of the IMS process.

As shown in FIG. 3C, the solder material is illustrated as having filled all of the feature holes. The upper and lower decals are then separated or peeled away from the center decal layer, as depicted in FIG. 3D, while permitting the solder 62 to remain, as shown in FIG. 3C, in the feature holes 38 and with the solder projecting from the opposite surfaces of the center decal layer 32. Thereafter, as illustrated in FIG. 3D, adhesive material layers 64, 66 are applied onto the opposite surfaces of the solder-filled center decal layer 32; and as shown in FIG. 3E, a semiconductor chip 68 is applied to the upper adhesive material 64, wherein a substrate 70 is applied onto the upper surface of carrier stage 52 below the lower surface of the center decal 32, with alignment pins 54 extending upwardly through the alignment apertures 46 of the center decal layers 32. The flip chip assembly 68 is then applied to the adhesive 64 on the upper surface of the center decal layer, as shown in FIG. 3E, for alignment and thermal bonding, prior to separation of the adhesive-bonded components at the perforations 40 in the center decal layer. Alternatively, referring to FIG. 3G, the adhesives 64, 66 can be applied to, respectively, the surface of chip 68 and to the substrate 70 facing layer 32 instead of to the opposite surfaces of the latter.

Pursuant to the representation of FIG. 3E and FIG. 3F, alignment and thermal compression bonding can be implemented to the superimposed components, whereby the center decal layer with the flip chip 68 which has been superimposed on the adhesive 64 on the upper of the center decal 32, as shown by an input conveyor, is separated into individual chips 68 by separation along the perforations surrounding respective square areas (shown in FIG. 3F) containing arrays of each of the feature holes 38 that contain solder material 62 in the center decal layer 32. This is implemented by a vertical offsetting or displacement between portions of the carrier stage 52 and the perforation-encompassed portion of the film web forming the center decal 32, as shown in FIG. 3F of the drawings so as to shear this portion from the remaining web length.

The top and bottom decal layers 30, 34 which have been previously peeled away from the solder-filled center decal layer 32 of the three superimposed decals can then be wound onto further reels or removed, and can be reused, as may be necessary, for further or repeated processing.

The adhesive material 64, 66 may be also constituted of a flux material which has been applied previously onto both sides of the center decal layer 32 as shown in FIG. 3D, for implementing the desired adhesion between the flip chip 68, the center decal layer 32 and the substrate 70, as well as serving for wetting of the solder 62 to correlate with conductive pads (not shown) that are provided on both a silicon die 68 and an organic substrate 70.

A final sample of the resultingly assembled flip chip assembly is presented in FIG. 3F and FIG. 3H. The perforations 40 as provided encompassing the area of the respective arrays of feature holes 38 enable the detached portion of center decal layer 32 to be separated from the carrier stage 52 and then integrated into the flip chip assembly.

Alternatively, similar to FIG. 3D, it is however possible to apply the adhesive 64, 66 directly onto the flip chip 68 and the substrate 70 prior to implementing the assembling process as shown in FIG. 3G, rather than applying the adhesive to the opposite surfaces of the center decal layer 32 which has been previously separated from the upper and lower decal layers 30, 34, whereby for the remainder, the process is identical with that as previously described. Moreover, the number of decal layers as utilized in FIGS. 2A and 2B of the drawings can be varied, depending upon the configuration of the UBM (Under Bump Material) of the chip and pad provided on the substrate.

Figure 4A:
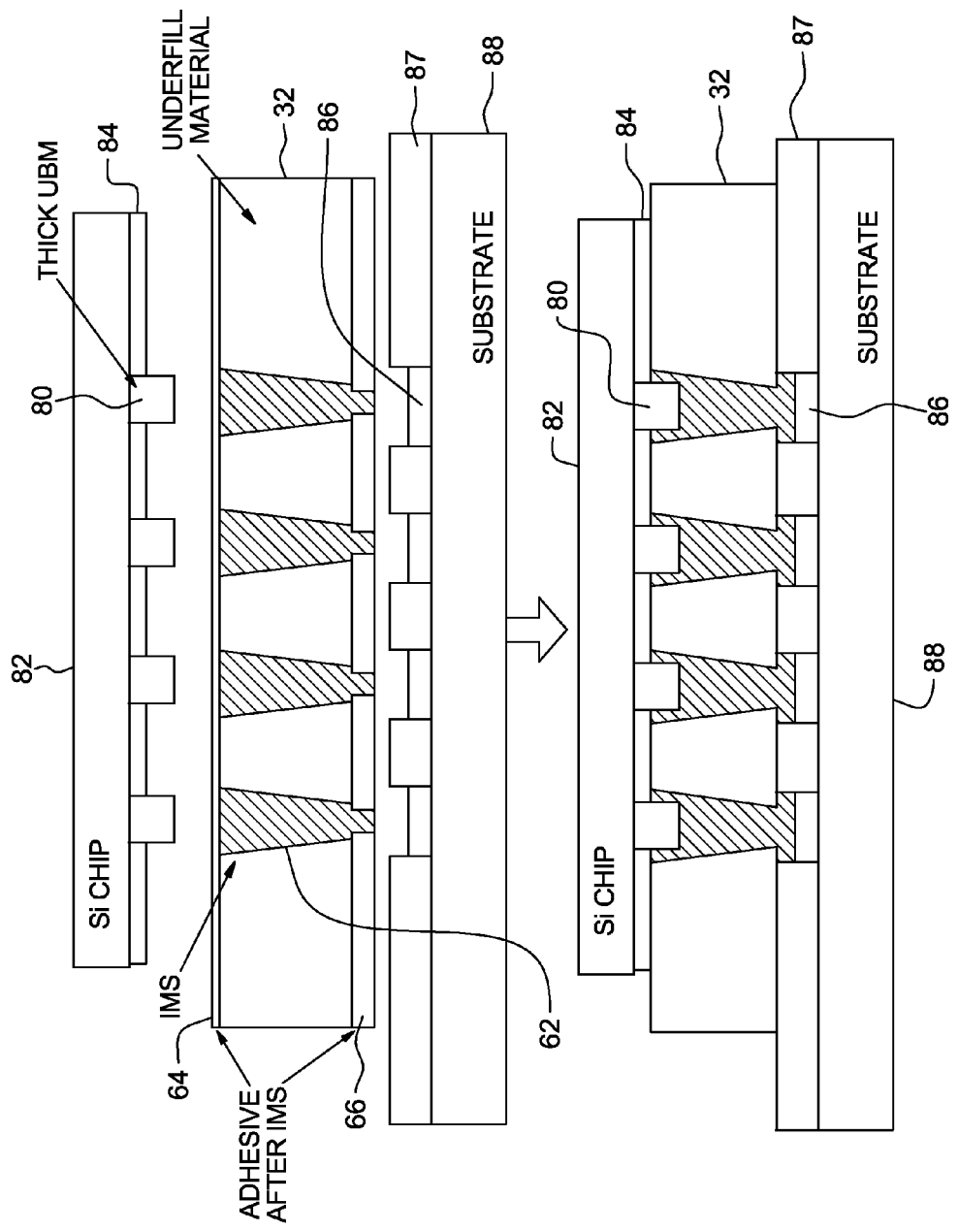
FIG. 4A illustrates an embodiment of the inventive process.
Figure 4B:
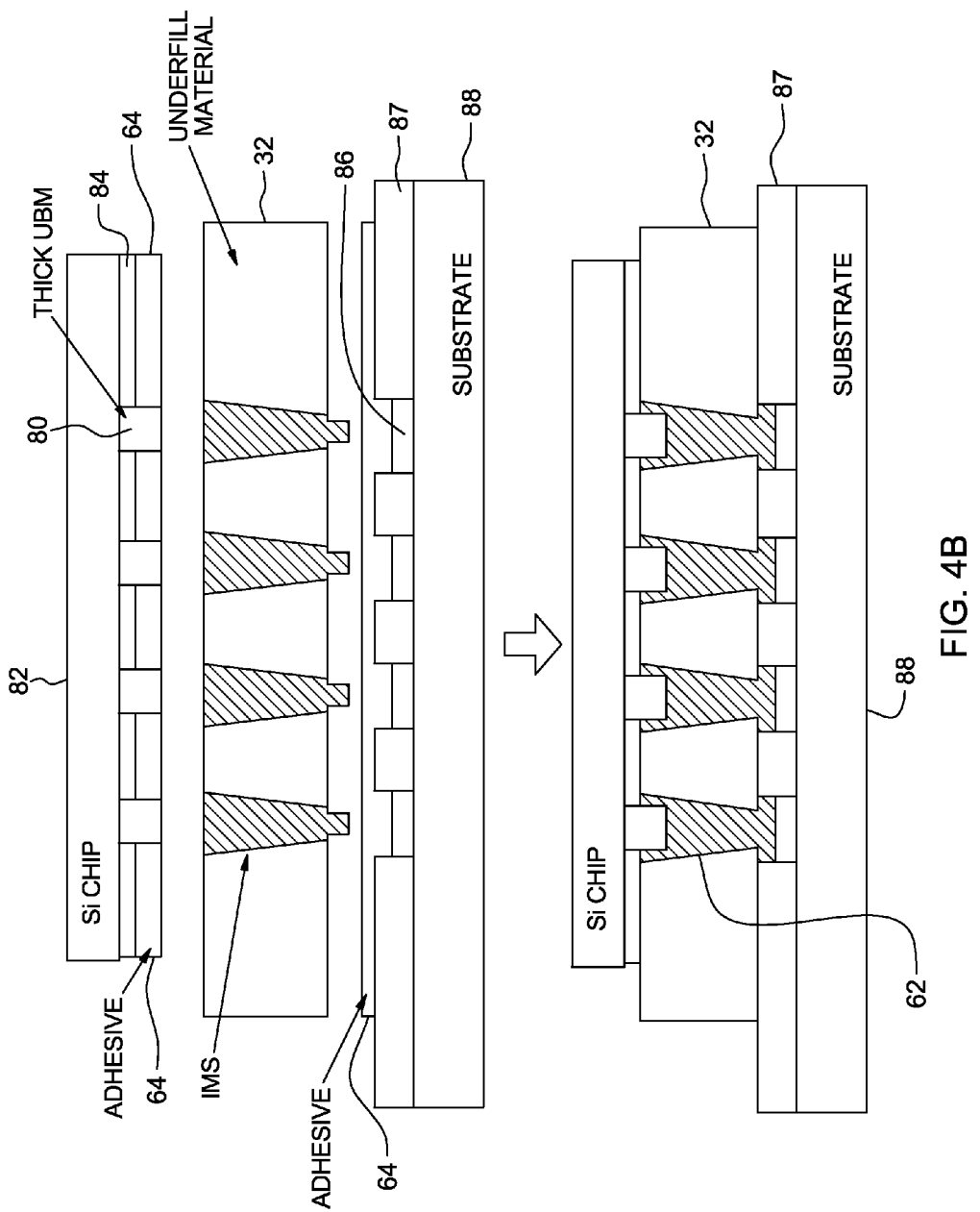
FIG. 4B illustrates a modified embodiment of the process.

Reverting to the arrangement as shown in FIG. 4A providing for thick UBMs 80, passivation layer 84, and two layers 64, 66 of adhesive, there is illustrated the center decal 32, and upper and lower adhesive comprising two layers 64, 66 utilized in the manufacturing of the flip chip assembly, having thick UBMs and a substrate possessing conventional pads 86. The substrate 88 contains recessed pads 86 which are well below the solder resist surface 87. In this instance, two layers of decals are employed to effect the extrusion of solder out of the surface for providing the contact between the solder and the pad on the substrate. As shown in FIG. 4B, this also illustrates the adhesive 64 being applied to the bottom of a silicon chip 82 and about the thick UBMs 80, and adhesive 64 applied to pads 86 on the substrate 88 prior to assembly or compression, with the underfill material being formed by the center decal layer 32 having the solder material 62 contained therein.

Figure 5A:
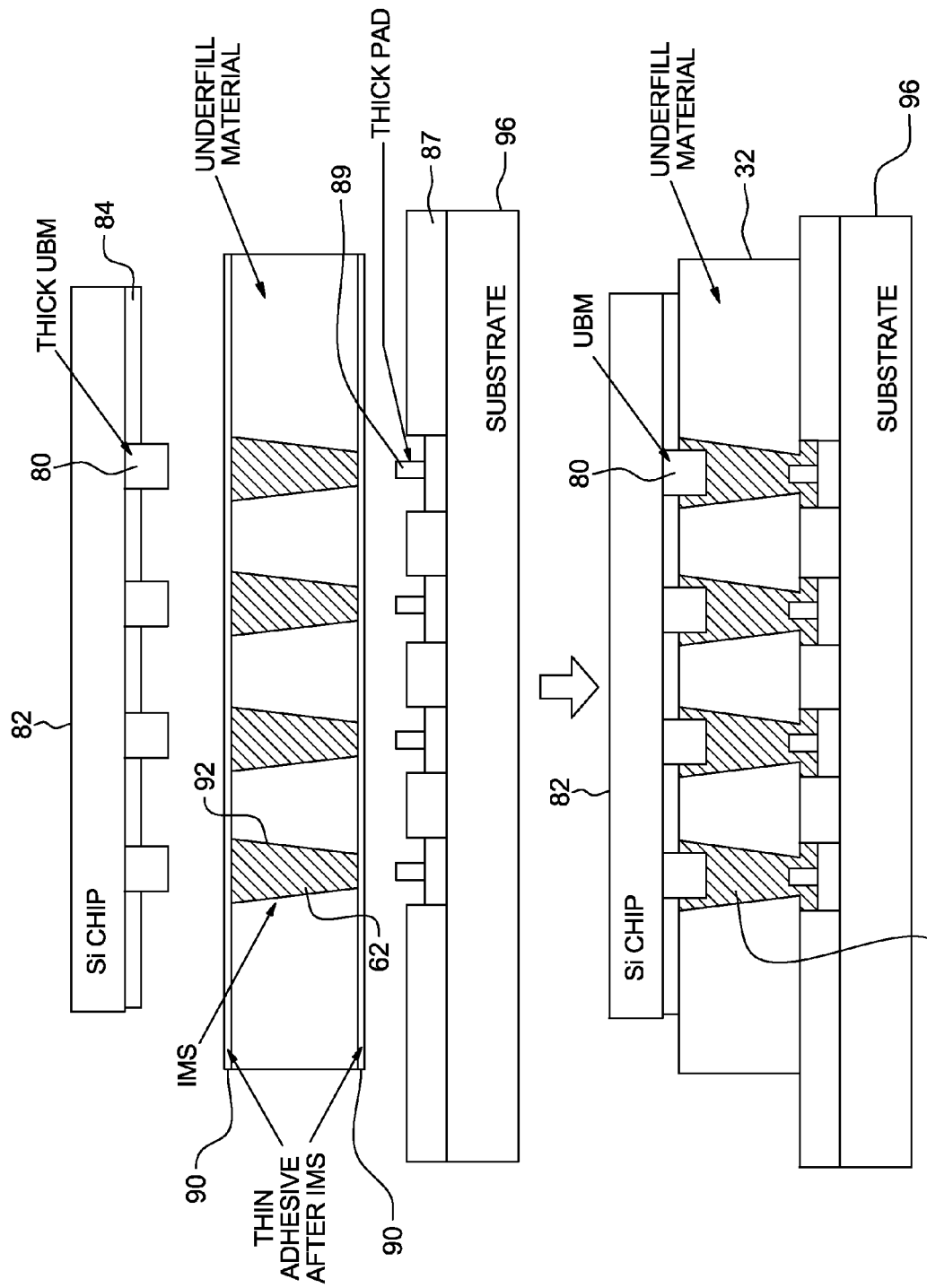
FIG. 5A through 6B illustrates, respectively, further modified embodiments in the manufacture of the decals.

Represented in FIG. 5A, are thick UBMs 80 and pads 89 with a single layer of film; in this instance, after the IMS process with the solder 62 having been filled into the tapered holes 92 formed in the underfill material 32, a thin adhesive 90 being applied to opposite sides of the underfill material formed by the center decal 32. Positioned therebeneath is a substrate 96 having pads 89 thereon, and upon the application of the solder 62 to the silicon chip with the UBMs, the components are then pressed together.

Figure 5B:
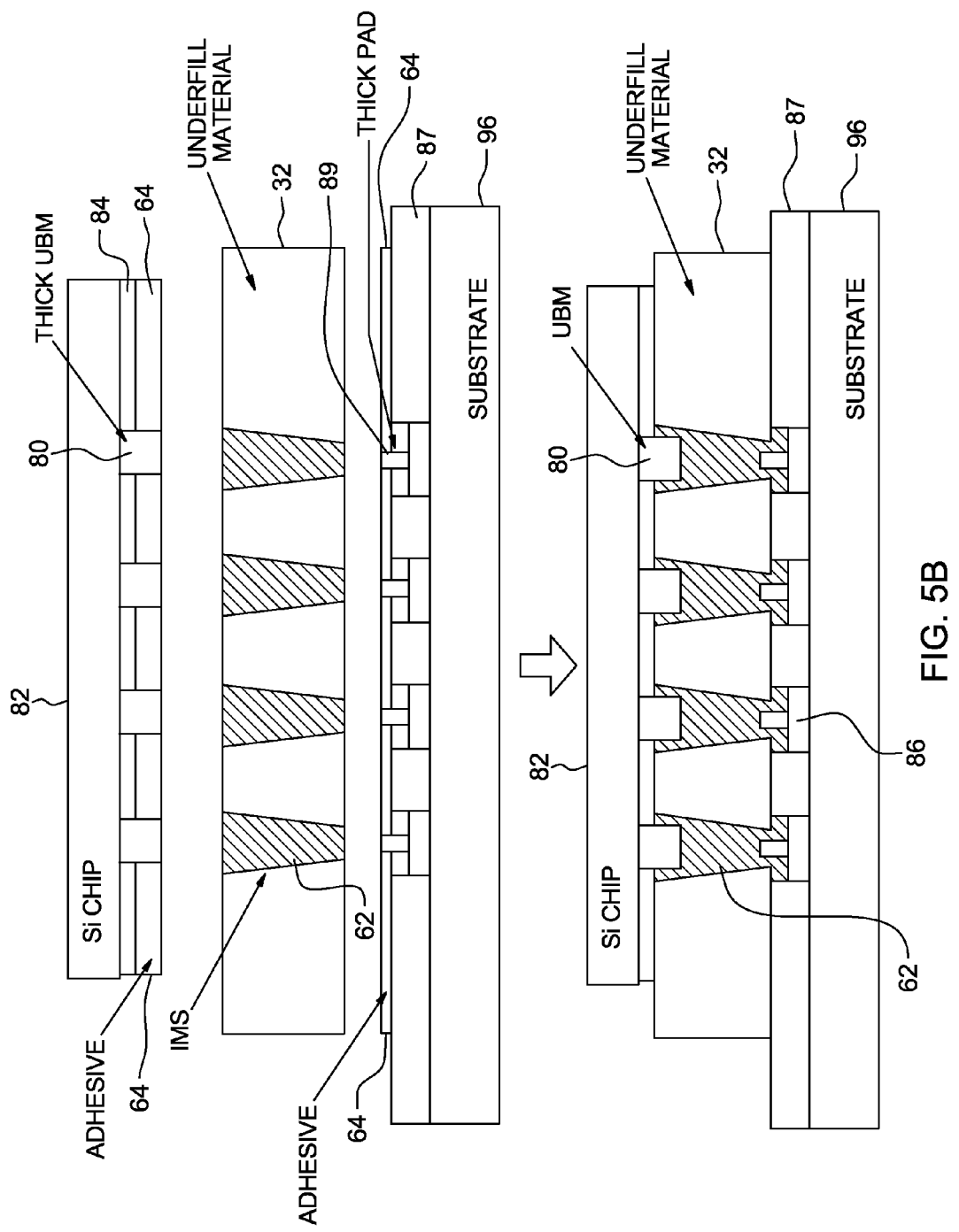

As shown in FIG. 5B, in this instance the thick UBMs 80 and pad 89 employ a single layer film web 32 similar to that of FIG. 5A, wherein a thick pad is provided on the substrate 96 and adhesive 64 applied thereon, and also on the lower side of the silicon chip 82 and the thick UBMs, and thereafter the components are pressed together.

Figure 6A:
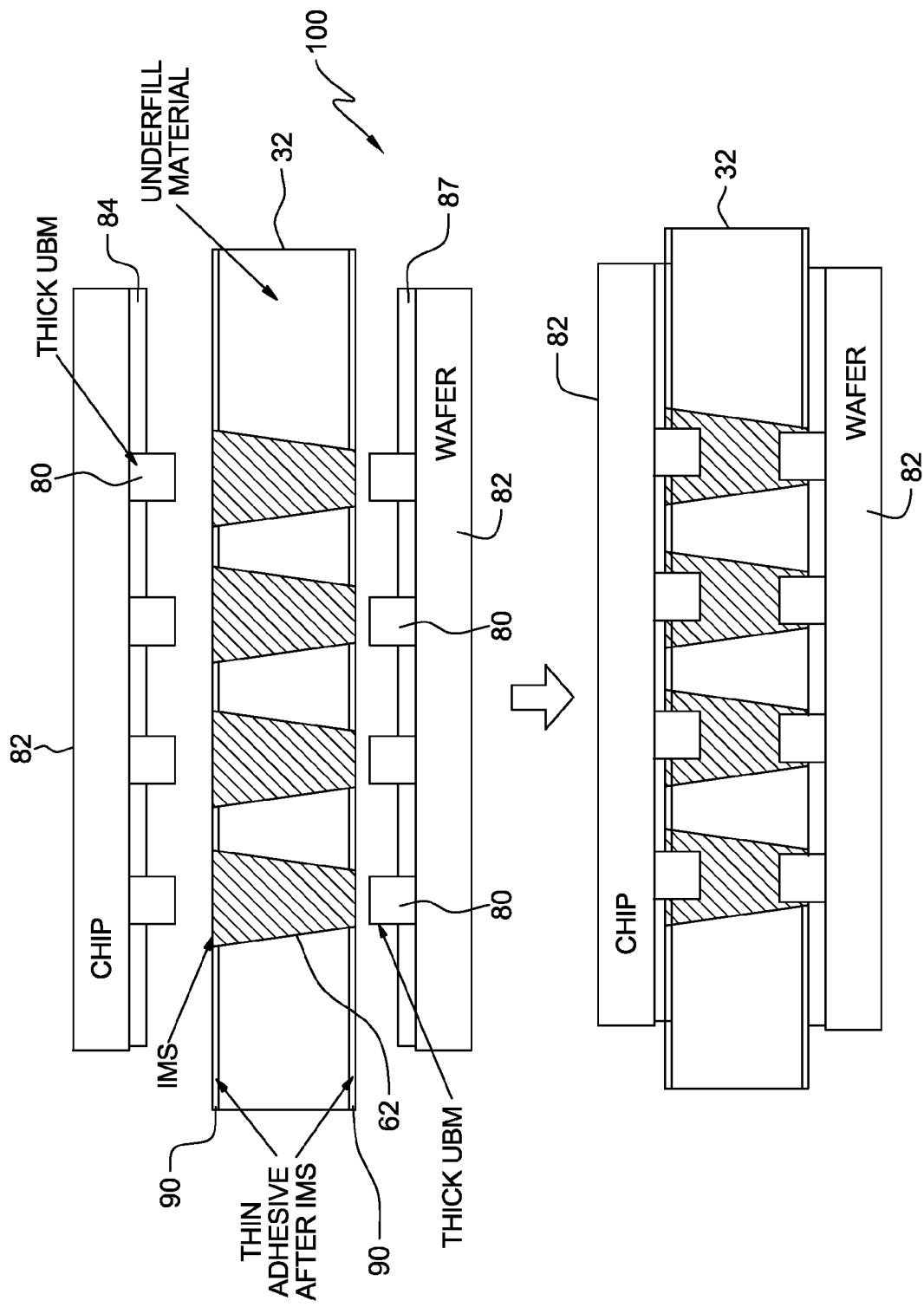

As illustrated in FIG. 6A, there is illustrated a chip-to-chip bonding arrangement 100 with a thick UBM 80 and a single layer of film 32 which is generally similar to the embodiments of FIG. 5B. However, in this instance, silicon chips having thick UBMs facing the underfill material decal are provided on both sides thereof and then pressed together, whereby the silicon chips have each of the UBMs pressed into the underfill layer into contact with the solder material 62.

Figure 6B:
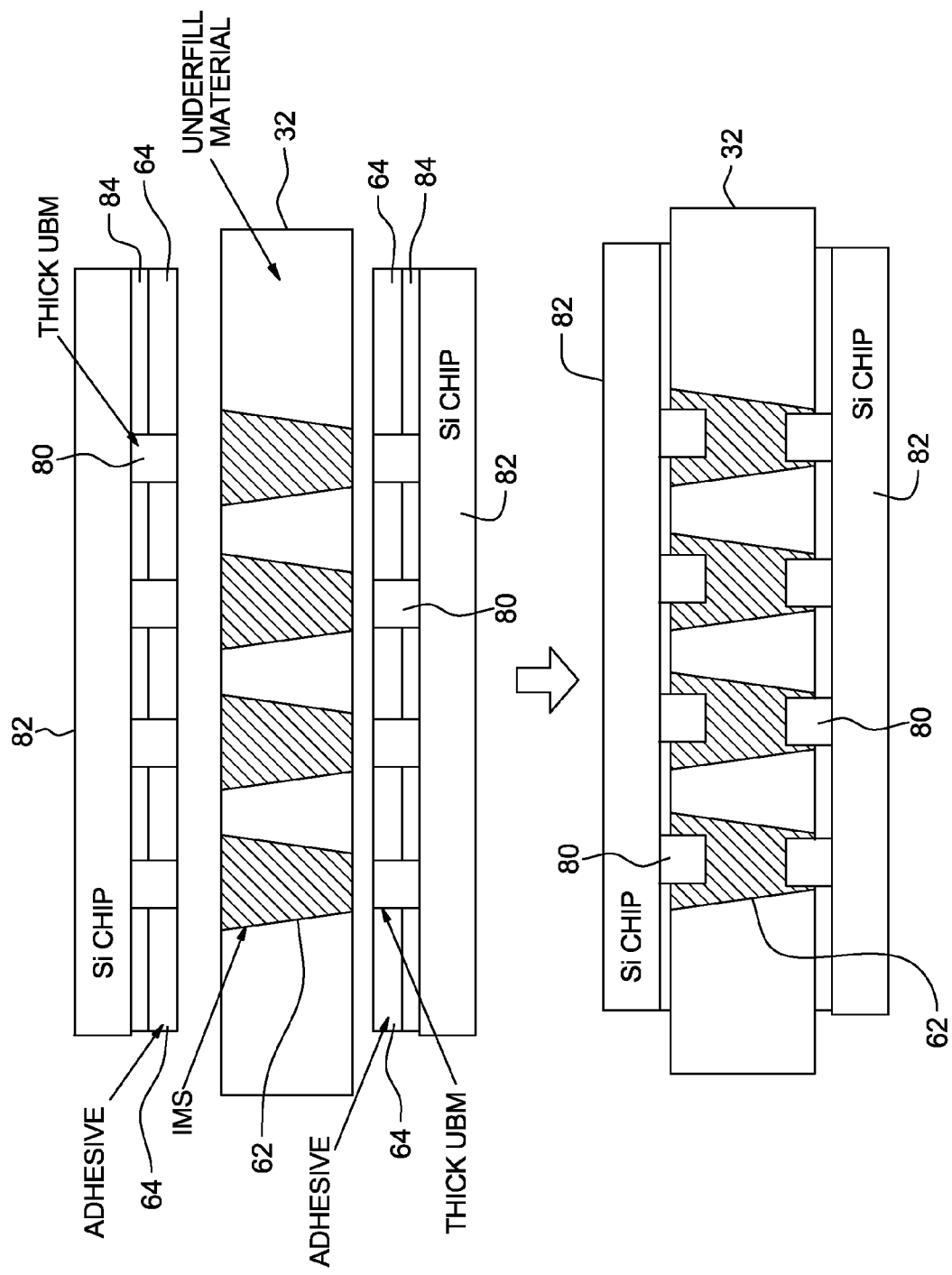

Referring to FIG. 6B, there is provided a die-to-die bonding arrangement with a thick UBM and a single layer of film 32, which is generally similar to the structure of FIG. 6A, and wherein, in this instance, adhesive material 84 is again applied to the surfaces of the silicon chip 82 facing towards the underfill material decal layer 32 containing the solder 62, subsequent to implementing of the IMS process, and the components are thereafter pressed together.

Figure 7A:
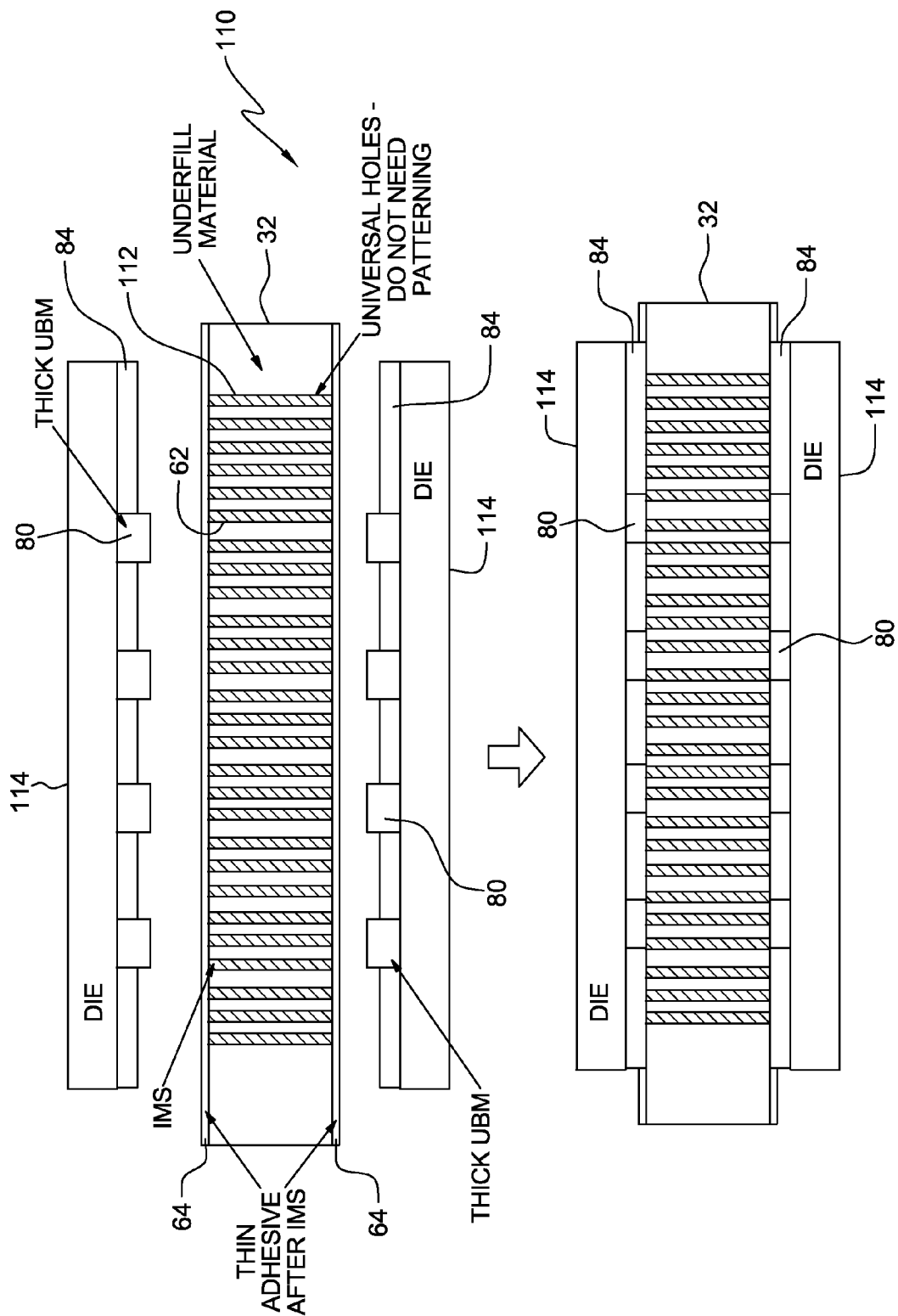
FIGS. 7A and 7B illustrates, respectively, alternative embodiments of the inventive process.
Figure 7B:
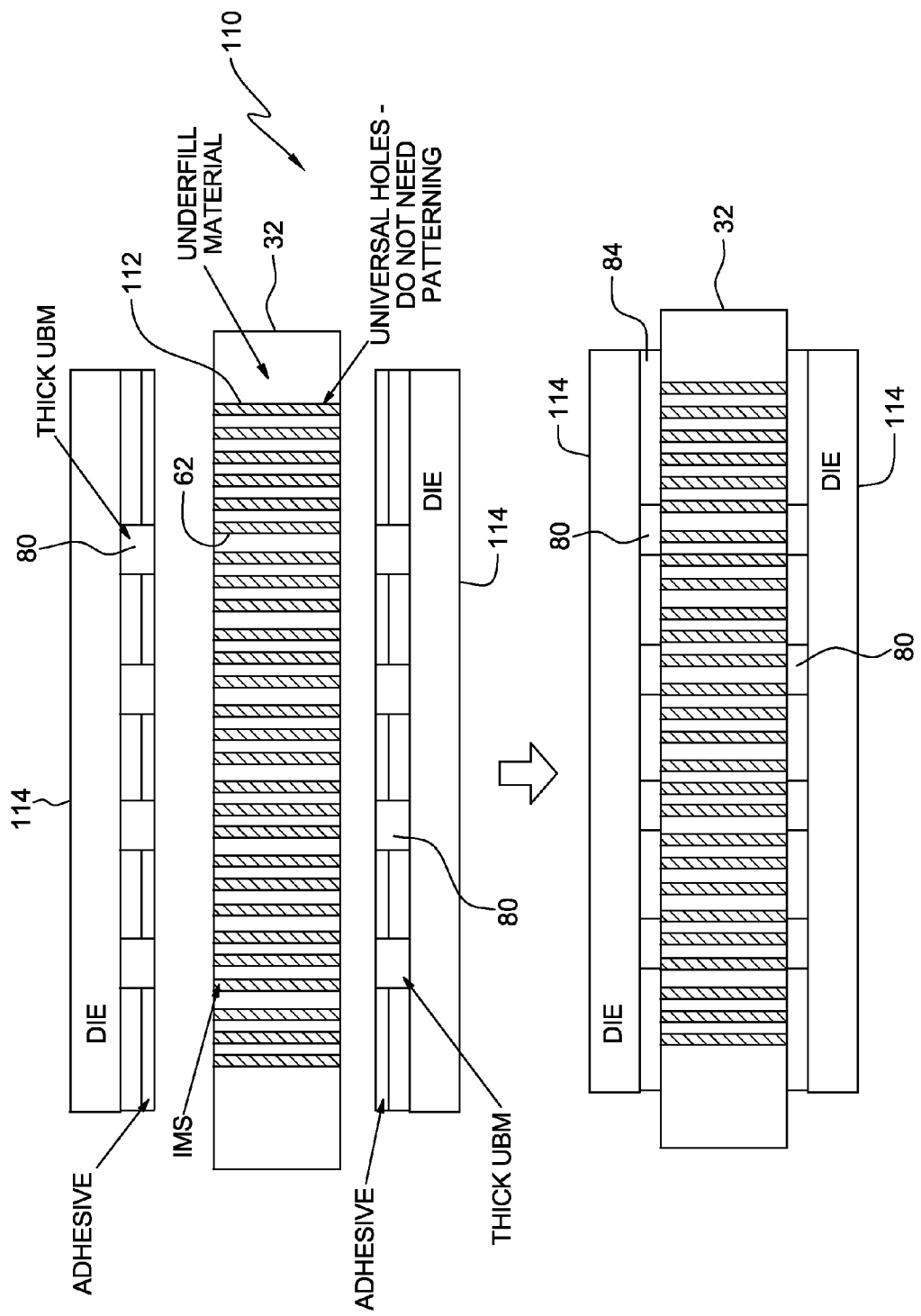

As illustrated in, respectively, FIGS. 7A and 7B, there is provided a die-to-die bonding arrangement 110 including thick UBM 80 with a single layer of film 32 wherein the underfill material in FIG. 7A includes a thin coating of an adhesive 64 provided after the IMS process, a large plurality of feature holes 112 being filled with the solder material 62 and wherein each die 114 contains UBMs facing towards the thin adhesive, and is then pressed into contact with the opposite surfaces of the underfill decal material so as to produce electrical contact with the plurality holes containing the solder 62.

The foregoing is also generally similar in FIG. 7B, wherein the adhesive is applied to the surface of the underfill material in contact with the surfaces of the dies and extending about the thick UBMs, whereby subsequent to pressing the dies against the opposite surfaces of the underfill material this process will provide for the necessary electrical contact with the solder material in the feature holes.

The position of the holes in the decal layer having the solder contained therein, as shown respectively, in FIGS. 7A and 7B enables an electron flow in a direction which is not perpendicular to the longitudinal direction, and which enables the method and apparatus be applied to the manufacture of ultrafine pitch products, thereby saving valuable process time since there is no requirement for any precise alignment having to be implemented among the semiconductor chip, decal layer and any substrate components.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. An apparatus for soldering a semiconductor chip to a substrate comprising:
   (a) an arrangement of supply spools for supplying a plurality of apertured decals, said plurality of apertured decals including an upper layer having upper alignment holes and upper tapered feature holes, a center layer having arrays of center through feature holes in alignment with said upper tapered feature holes and in alignment with lower through feature holes in a bottom layer located on an opposite side of said center layer; a plurality of perforations extending through said center layer defining specific areas encompassing said arrays of center feature holes; and center alignment holes in said center layer in alignment with lower alignment holes in said bottom layer;
   (b) a carrier stage having the substrate located thereon being located beneath said bottom layer, said carrier having upstanding pin numbers extending through the upper alignment holes, center alignment holes, and lower alignment holes;
   (c) an injection molder for filling the upper tapered feature holes, said center feature holes, and said lower feature holes with solder;
   (d) a device for separating said upper layer and said bottom layer from said center layer and for applying an adhesive layer to the exposed surfaces of said center layer having solder portions projecting from the center layer;
   (e) a device for positioning said semiconductor chips on at least the exposed upper surface of said center layer in alignment with the areas defined by said plurality of perforations and in contact with said adhesive layer and said solder portions protecting from the center layer; and
   (f) a separating structure for detaching said semiconductor chips with the center layer filled with solder along the plurality of perforations from a remainder of said center layer.

2. The apparatus as claimed in claim 1, wherein electrically conductive pads are interposed between electronic components on said substrate and said semiconductor chip.

3. The apparatus as claimed in claim 1, wherein said center layer comprises an underfill material.

4. The apparatus as claimed in claim 1, wherein said semiconductor chip includes recesses facing said center layer, under bump materials (UBM) being positioned on said adhesive and said solder portions projecting from the center layer.

5. The apparatus as claimed in claim 1, wherein said upper layer, said center layer and said bottom layer of the plurality of apertured decals are in the form of continuous film webs feed from said supply spools.

6. The apparatus as claimed in claim 5, wherein said film webs are constituted of polyimides selected to withstand an injection molding solder (IMS) process conducted at the melting temperature for the solder.

7. The apparatus as claimed in claim 6, wherein said center layer comprises a filler-containing polymer for enhancing the coefficient of thermal expansion (CTE) of said layer as an underfill material.

8. The apparatus as claimed in claim 1, wherein the upper tapered feature holes formed in said upper layer and the lower feature holes in the bottom layer have larger ends thereof adjacent said center layer so as to facilitate the peeling away of said upper layer and said bottom layer from said center layer.

9. The apparatus as claimed in claim 1, wherein said center through feature holes extending through said center layer are conically tapered and at least at least at one of the opposite ends, have the solder contained therein contacted by under bump material (UBM) located on said semiconductor chips and by electrically conductive pads on said substrate.

* * * * *